United States Patent
Tahon et al.

(10) Patent No.: US 6,355,125 B1
(45) Date of Patent: Mar. 12, 2002

(54) METHOD FOR MAKING AN ELECTRIC OR ELECTRONIC MODULE COMPRISING A GLASS LAMINATE

(75) Inventors: Jean-Pierre Tahon, Langdorp; Bart Verlinden, Tongeren; Luc Leenders, Herentals; Rudi Goedeweeck, Rotselaar, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/520,993

(22) Filed: Mar. 8, 2000

Related U.S. Application Data
(60) Provisional application No. 60/127,478, filed on Apr. 2, 1999.

(30) Foreign Application Priority Data

Mar. 26, 1999 (EP) ................................................ 99200956

(51) Int. Cl.⁷ ........................ B32B 17/10; G02F 1/1333
(52) U.S. Cl. ........................... 156/99; 156/265; 156/277
(58) Field of Search ...................... 156/99, 101, 265, 156/297, 299, 277; 349/158; 428/1.6, 1.62

(56) References Cited

U.S. PATENT DOCUMENTS

| | | |
|---|---|---|
| 3,944,461 A | 3/1976 | Ogron |
| 5,091,258 A | 2/1992 | Moran |
| 6,120,907 A * | 9/2000 | Tahon et al. ................ 428/426 |

FOREIGN PATENT DOCUMENTS

| | | |
|---|---|---|
| DE | 40 38 498 A1 | 6/1992 |
| WO | WO 97/03763 A | 2/1997 |
| WO | WO 99/21707 A | 5/1999 |

\* cited by examiner

*Primary Examiner*—Jeff H. Aftergut
*Assistant Examiner*—John T. Haran
(74) *Attorney, Agent, or Firm*—Breiner & Breiner, L.L.C.

(57) ABSTRACT

A method is disclosed for making a module that can be used in an electric or electronic device such as a flat panel display, a light emitting diode or a photovoltaic cell. The figure shows as a preferred embodiment of the method of the present invention a schematic section of a panel consisting of three adjacent modules (liquid crystal display cells; only one is shown completely). The panel is obtained by assembling two substrates (2) and (8) which carry functional layer (3) and (9) respectively. The substrates are preferably flexible plastic foils. Thin glass sheets (1, 7) are laminated to the substrates (2, 8) so as to obtain an efficient barrier layer which protects the functional layers (3, 9) from mechanical damage, heat and degradation due to diffusion of oxygen or water vapor. The method is especially suitable for making flexible, low-weight flat panel displays, e.g. LCDs comprising a liquid crystal composition (6), spacers (4) and seals (5).

13 Claims, 1 Drawing Sheet

मेंटोड FOR MAKING AN ELECTRIC OR ELECTRONIC MODULE COMPRISING A GLASS LAMINATE

METHOD FOR MAKING AN ELECTRIC OR ELECTRONIC MODULE COMPRISING A GLASS LAMINATE

RELATED APPLICATION

This application is based on provisional application Ser. No. 60/127,478 filed Apr. 2, 1999.

DESCRIPTION

1. Field of the Invention

The present invention relates to a method for making an electric or electronic device such as a flat panel display, a light emitting diode or a photovoltaic cell. More specifically, the present invention relates to a method wherein a thin glass sheet is laminated to a substrate which is provided with one or more functional layers used in such electric or electronic devices, e.g. an electroconductive layer, a colour filter, a liquid crystal alignment layer, a phosphor layer, etc.

2. Background of the Invention

Liquid crystal displays (LCDs) have been used for several years now as an information display in e.g. calculators, watches, video games, audio and video equipment, portable computers, car dashboards, etc., i.e. especially in mobile devices wherein low weight is an important feature. Moreover, quality and size have been improved substantially so that LCDs are becoming an interesting alternative for the cathode ray tubes (CRTs) which are being used widely in television sets and desktop computer displays. In the meantime other flat panel display (FPD) types, such as plasma displays (PDs), field emission displays (FEDs) and organic light-emitting displays (OLEDs) are attracting a lot of attention as potential alternatives of LCDs. Being emissive displays, PDs, FEDs or OLEDs may provide a solution for two major problems associated with LCDs, i.e. the low viewing angle and low efficiency (typically, only a few percent of the incident light or backlight passes through an LCD to form a readable image).

In all these FPDs, two substrates are being used for carrying functional layers, e.g. electroconductive layers for pixel addressing, colour filters, liquid crystal orientation or alignment layers in LCDs or phosphor layers in FEDs and PDs. Between the two substrates provided with said functional layers, there may be applied a filling, e.g. a liquid crystal compound (LCDs), a light-emitting substance (LEDs) or a plasma-forming gas (PDs). After assembling such a panel, one or more foils can be laminated to the s outer surface of the glass substrate. In most LCDs polarisor foils are necessary components which are laminated to the glass substrate. In addition, several other types of foils are widely used to improve the image quality, e.g. retardation film, reflection or anti-reflection foils, foils which improve the viewing angle, light dispersion foils, etc.

The substrates used in such devices are typically glass plates having a thickness in the range from 0.7 to 1.1 mm. Due to the high specific weight of glass, the total weight of a display is mainly determined by the size and thickness of these glass plates. In "Fourth-Generation LCDs - EIAJ Display Forecast", published in "Display Devices", Spring '96, Ser. No. 13, p. 14–19 (published by Dempa Publications Inc., Tokyo), it is emphasised that weight reduction of FPDs is a major need to be investigated. Weight reduction is important for mobile displays as well as for large stationary displays such as television sets and desktop computer displays. A further reduction of the thickness of the glass plates is however limited due to the high brittleness of such thin glass.

For some low-cost applications, plastic sheets are being used as a low-weight substrate of a FPD. The high strength and flexibility of plastics even enables the making of a flexible display. In addition, the flexibility of plastic substrates enables the use of continuous processes for applying a functional layer thereon, e.g. using a web or roll coater or by printing, while the coating on glass typically proceeds in a batch process (sheet by sheet). However, the liquid crystal composition and other functional layers, especially the electroconductive layers, present between such plastic substrates are not well protected from chemicals, oxygen, moisture, mechanical impact and other external influences and, as a result, the lifetime of such plastic-based devices is limited. In addition, plastics have a very low thermal and dimensional stability compared to glass, which are essential properties required for obtaining high quality displays. As a result, quite some research is focused on the development of barrier layers which can be provided on plastic foils to reduce to diffusion of moisture and gases as described in e.g. U.S. Pat. No. 4,950,551; U.S. Pat. No. 5,589,252; and U.S. Pat. No. 5,820,994. Known examples of such barrier layers are the so-called Organically Modified Ceramic layers, as described in Coating, no. 9/98, p. 314 and 10/97, p. 358, and the poly(hydroxy amide ethers) described in Macromolecules, vol. 31, p. 8281 (1998).

As a solution for the above problems, WO99/21707 and WO99/21708 propose to use a laminate as substrate which comprises a glass layer, an adhesive layer and a plastic support. Such glass/plastic laminates combine the advantageous properties of glass and plastics. The glass protects the plastic substrate from scratches, moisture, solvents and gases, and improves the dimensional and thermal stability of the substrate. When a thin glass is used, e.g. a glass as described in EP-A-716339, the glass/plastic laminate is flexible and can be wound around a core, enabling the use of web or roll coating methods. The devices which are obtained using such glass/plastic laminates as substrate are characterised by a lower weight than full-glass based devices and by a lower probability of breakage of the substrate during handling or dropping the device.

Two problems are associated with these glass/plastic laminates. The functional layers needed in electric or electronic devices such as FPDs, photovoltaic cells and LEDs are typically applied on the substrate using methods such as sputtering, photolithography, physical vapour deposition, chemical vapour deposition, etc. During these processes, the substrate is subjected to high temperature and/or chemical treatments with various organic solvents and acid or alkaline solutions. As a result, the glass/plastic laminates described above may curl or even break due to the different thermal expansion coefficient of glass and plastic or the adhesive layer may be degraded so that the bond between the glass and plastic is destroyed. Another problem is associated with the cutting of glass/plastic laminates. At present, FPDs such as LCDs are being manufactured from substrates having a large size up to 500×400 or even 650×550 mm. After assembling the panel, the substrates are cut so as to obtain from two to nine modules (displays cells) from one panel. Using glass/plastic laminates as substrate requires complicated cutting tools, especially when one takes into account that the substrates of an LCD are typically being cut asymmetrically, i.e. the one substrate is cut at a different location than the other so as to obtain a Z-shaped edge.

SUMMARY OF THE INVENTION

It is an object of the present invention to provide a method of making a module for use in an electric or electronic device such as a FPD, a photovoltaic cell or a LED, wherein said module comprises a substrate which is characterised by the combined advantages of glass and plastic and which enables the use of the known methods for applying a functional layer on a substrate such as sputtering, photolithography, physical vapour deposition, chemical vapour deposition, etc. as well as the coating or printing methods which require a flexible substrate. The above object is realised by the method having the specific features defined in claim 1.

It is another object of the present invention to provide a method for making a panel comprising a plurality of modules as characterised above, wherein the modules can be cut from the panel with simple tools. This object is realised by the method defined in claim 2 or 3.

Specific features for preferred embodiments of the invention are disclosed in the dependent claims.

Further advantages and embodiments of the present invention will become apparent from the following description.

DETAILED DESCRIPTION OF THE INVENTION

Figure 1:
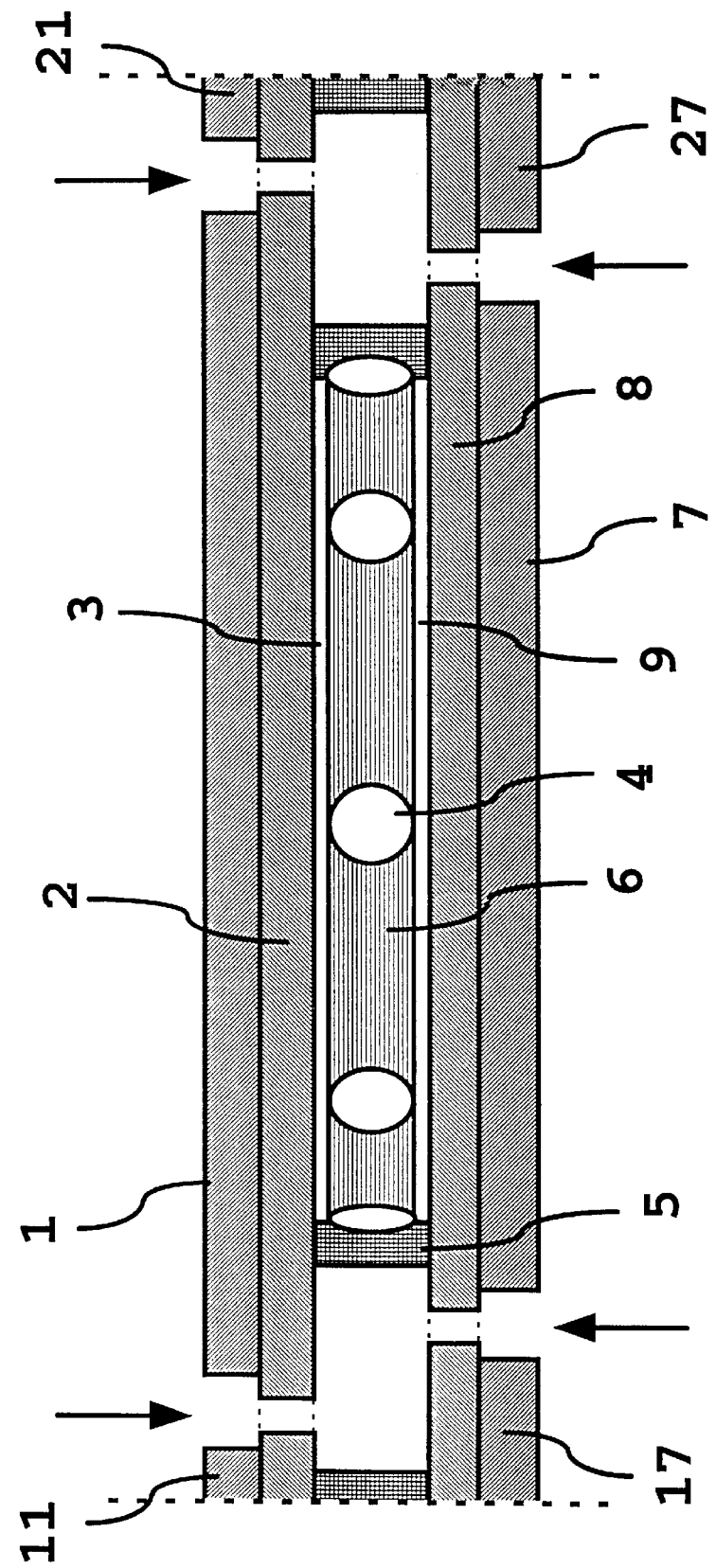
FIG. 1 is a schematic section of a panel consisting of three adjacent modules (liquid crystal display cells; only one is shown completely) obtained according to the method of the present invention; the various elements are not drawn to scale.

According to the method of the present invention, a first flexible substrate, e.g. a plastic foil, is provided with one or more layer(s) which are necessary for making an electric or electronic device such as a FPD, a photovoltaic cell or a LED. Said first substrate, carrying such functional layer(s), is then brought into parallel contact with a second substrate, which may also have been provided with one or more functional layer(s)so as to obtain an assembled sandwich, defined herein as 'panel' (or module if the panel comprises just a single module), wherein the one or more functional layer(s) are present between the first and the second substrate. After obtaining said panel, a thin glass sheet is laminated to the panel so as to provide a perfect barrier layer which protects the substrate and functional layers from mechanical impact, heat, and degradation due to diffusion of gases such as oxygen or water vapour. The panel can then be cut into a plurality of modules (also called display cells when the device is a FPD). Alternatively, the panel can first be cut into a plurality of modules and then be provided with a laminated thin glass sheet as barrier layer. In some embodiments of the present invention, e.g. for making large displays, the panel may comprise just a single module.

Both substrates may be the same or different. Also the functional layer(s) on both substrates can be the same or different. In a highly preferred embodiment, both substrates are flexible and are provided with one or more functional layer(s) using a web- or roll-coating or -printing technique. This method enables to produce low cost devices by using continuous methods for applying a functional layer to a flexible substrate, without the drawbacks of known plastic-based devices, i.e. reduced lifetime due to diffusion of moisture and gases, especially oxygen, through the plastic substrate.

The method of the present invention is further illustrated by the preferred embodiment of FIG. 1, showing a liquid crystal display panel. A flexible substrate 2 is provided with a functional layer 3. Likewise, substrate 8 is provided with functional layer 9. The seals 5 can be applied on the substrate by e.g. screen printing or offset printing and are formed of e.g. an epoxy, a silicone, a urethane, or an acrylic resin. Then, a panel is assembled wherein both substrates 2 and 8, separated by spacers 4, are brought into parallel contact. The display cell is filled with liquid crystal composition 6 and finally glass sheets 1 and 7 are laminated to substrate 2 and 8 respectively.

A panel in the method of the present invention may comprise a single or a plurality of modules. In the embodiment of FIG. 1, a panel is shown which comprises three modules. These modules can be cut from the panel at the boundary between said modules, indicated by the arrows in FIG. 1. The modules can be cut symmetrically (both substrates at identical positions) or asymmetrically as shown in FIG. 1, which is a typical method of cutting LCD cells from a panel.

In the embodiment of FIG. 1, it is advantageous to shield each module separately by laminating to the panel a plurality of adjacent glass sheets 1, 11, 21 and 7, 17, 27 of about the same size as a module in such a way that each laminated glass sheet is aligned with a module and a space is left between the laminated glass sheets, said space being aligned with the boundary between the modules. As a result, the substrate can by cut easily (illustrated in FIG. 1 by is the dashed lines which are indicated by the arrows) at the non-laminated space using common tools such as a knife, scissors, or local melting of the substrate. Alternatively, the modules may first be cut and then laminated to a glass sheet.

When a single glass sheet of about the same size as the whole panel is laminated so as to cover the complete panel without leaving. a space at the boundary between the modules, the panel can be cut by first removing the glass (e.g. by grinding a groove therein) along the boundary between the modules and then cutting the substrate as described above.

It shall be understood that the methods of laminating and cutting described above are not limited to the specific embodiment of FIG. 1 (an LCD) but may be used for making any module within the scope of the claims.

In the cut modules thus obtained, the edges of the substrates are not covered by glass. These edges can be shielded from oxygen and water vapour by applying thereon a resin or other composition (not shown in FIG. 1) which completely covers all sides of said edges. Said resin or composition may consist of e.g. the same material as seals 5. Alternatively, the edges of the substrate can be sealed by applying two glass sheets on opposite sides of the module according to the present invention and then fusing the edges of the glass sheets together, e.g. using a high power laser. The latter method provides fully closed modules, which are completely 'wrapped up' in glass and thus effectively protected from degradation due to e.g. oxygen and water vapour.

It shall be understood that the present invention also covers methods wherein the glass sheet is not laminated directly to the substrate, but also methods wherein first one or more additional foils are laminated to the substrate, followed by lamination of the glass sheet(s). Examples of such foils, e.g. used in LCD manufacturing, are retardation film, reflection or anti-reflection foil, foils which improve the viewing angle, light dispersion foils, polarisors, etc. Illustrating the latter alternative embodiment by the panel of FIG. 1, it shall be understood that one or more additional foil(s) may be present between the glass sheet 1 and substrate 2.

According to still another embodiment of the invention, a glass/support laminate may be laminated to the panel, either by laminating the glass side of the glass/support laminate to the panel or by laminating the support side of said laminate to the panel. The support of such a glass/support laminate may be e.g. one of the additional foils referred to above. More details about suitable glass/support laminates for use in the present invention can be found in WO99/21707 and WO99/21708.

The glass used in the present invention has a thickness of not less than 10 μm and not more than 1.5 mm. To reduce the weight of the electric or electronic device, it may be preferred to use glass having a thickness less than 700 μm or even less than 500 μm. A flexible device can be obtained by laminating a flexible thin glass sheet, e.g. as described in EP-A-716339, to the module. For such applications, a thickness lower than 300 μm or even lower than 200 μm may be preferred. For lower brittleness a thickness of not less than 30 μm or even not less than 50 μm may be preferred.

The glass may be e.g. sodium float glass, chemically strengthened glass or borosilicate glass. Such glass can be made by squeezing semi-molten glass between metal rollers to produce a thin web. U.S. Pat. No. 4,388,368 describes the following method to produce flexible glass sheets. A soda lime glass ($Na_2O.CaO.SiO_2$=15:13:72 by weight) molten at 1550° C. is drawn and rolled. The glass thus formed is supported by clips at both ends and heated at about 350° C. Thereafter the glass sheet is stretched to from 1.05 to 10 times the area of the original sheet while blowing a hot blast of air at a temperature lower than the aforesaid heating temperature onto the glass sheet, e.g. about 700° C. In this way, the glass sheet is cooled faster at thin portions, and thereby the thickness of the S glass sheet thus stretched is maintained uniform. A similar method has been described in JP-A 58,095,622. In another method, described in JP-A 58,145,627, a web of molten glass is pulled upward and immediately drawn horizontally using large rollers onto the surface of a molten metal bath, followed by gradual cooling. The glass thus obtained has improved flatness.

Chemically strengthened float glass is known to have greater strength than regular float glass. Chemically strengthened glass is glass wherein at both surface layers the original alkali ions are at least partially replaced by alkali ions having a larger radius. In chemically hardened sodium lime silica glass, the sodium ions near the surface of the glass are at least partially substituted by potassium and in chemically hardened lithium lime silica glass, the lithium ions near the surface are at least partially substituted by sodium and/or potassium. Known methods for producing chemically strengthened glass are processes wherein glass is exposed to ion exchange conditions as described in e.g. JP-A 56,041,859, GB 1,208,153 and U.S. Pat. No. 3,639,198. More details about chemical strengthening of glass are given in e.g. "Glass Technology", Vol. 6, No. 3, page 90–97, Jun. 1965.

Highly preferred glass for use in the present invention is thin borosilicate glass which is very strong compared to regular sodium float glass. Borosilicate glass comprises $SiO_2$ and $B_2O_3$. The detailed composition of some borosilicate glass types has been described in e.g. U.S. Pat. Nos. 4,870,034, 4,554,259 and 5,547,904.

Flexible, thin glass is commercially available, e.g. from Pilkington and Corning. Preferred thin borosilicate glass for use in the method of the present invention is commercially available from e.g. Deutsche Spezialglass AG (Desag, Germany), a Schott Group company, as types AF45 and D263 with a thickness as low as 30 μm According to the technical brochure "Alkali Free and Low Alkali Thin Glasses", subtitle "AF45 and D263: Thin Glasses for Electronic Applications", published by Desag in 1995, thin borosilicate glass is available in a thickness of 30 μm, 50 μm, 70 μm, 100 μm, 145 μm, 175 μm, 210 μm, 300 μm, 400 μm, 550 μm and 700 μm.

The flexible substrate used in the method of the present invention has preferably a thickness of less than 500 μm, more s preferably less than 250 μm and most preferably less than 100 μm. It may be a metal foil, paper, or a plastic formed of one or more material(s) selected from the group consisting of polyether resin, cellulose resins such as cellulose diacetate, cellulose triacetate and butyl acetate, polyethersulfone (PES) resin, acrylic resin, poly(ethylene terephthalate) (PET) resin, phenoxy resin, phenoxy-urethane resin, urethan resin, polyether-ketone resin, polyether-etherketone resin, polyimide-amide resin, polycarbonate (PC) resin, polysulfone resin, polyethylene resin, or polypropylene resin. Also copolymers can be used, e.g. a copolymer of acrylonitrile, styrene and butadiene or cyclo-olephine copolymers (COCs) such as copolymers comprising (poly) dicyclopentadieen (PDCP). PET, PC, PES and PDCP are highly preferred. PES and PDCP are especially preferred for applying functional layers by high temperature processes. Alternatively, the substrate may consist of multilayers formed of some materials of the above mentioned resins. The substrate itself may also be or comprise a polarising film.

Both substrates can be the same or different. For example, one substrate may be a plastic film and the other a glass plate so as to obtain a hybrid device. One of the substrates of the module may be coated with a reflecting layer or laminated to a reflective foil, e.g. to make a reflective display.

The glass sheet or the glass/support laminate which is laminated to the panel according to the present invention may be provided with an additional barrier layer to reduce permeability of gases such as oxygen or water vapour in case the glass sheet fractures when the device is dropped. Organic as well as inorganic barrier layers are known in the art. Organic barrier layers may comprise e.g. poly(vinyl alcohol), polyacrylonitrile, poly(vinyl butyral), which may be mixed with an epoxy resin, or the Organically Modified Ceramic layers and the poly(hydroxy amide ethers) referred to in the background description. Inorganic barrier layers are typically thin films of sputtered oxides, e.g. $SiO_X$ or $Ta_2O_5$. The thickness of such inorganic barrier layers is preferably lower than 2 μm, and preferably about 1 μm so as to obtain some flexibility. It may be advantageous to combine inorganic and organic barrier layers, e.g. a $SiO_X$ layer overcoated with an Organically Modified Ceramic layer, since the uneven surface of an anorganic layer which is typically applied by vapour deposition or sputtering can be leveled off by overcoating with the organic layer.

Methods for laminating the glass sheet to the module are well known. Both layers may be laminated without the use of an adhesive layer by so-called vacuum lamination. In order to obtain an effective bond between the glass layer and the substrate by vacuum lamination, both these materials are preferably characterised by a low surface roughness, e.g. the substrate preferably does not contain a so-called spacing agent, which is often introduced in plastic foils or in coatings on foils to prevent sticking.

In addition to vacuum lamination, the use of double-sided adhesive tape or an adhesive layer, obtained by applying e.g. a hotmelt, a pressure- or thermo-sensitive adhesive, or a UV or electron-beam curable adhesive. Alternatively a slightly moistened gelatine layer can also be used as an adhesive layer. More information about suitable adhesive layers is described in WO99/21707 and WO99/21708. The adhesive layer may be applied either to the glass sheet, to the module, or to both and may be protected by a stripping layer, which is removed just before lamination. Polyethylene is a highly preferred adhesive, which can be applied as a foil between the glass and the substrate.

The functional layer can be applied on the substrate by sputtering, by physical vapour deposition, by chemical vapour deposition, as well as by coating from a liquid coating solution such as spin coating, dip coating, rod coating, blade coating, air knife coating, gravure coating, reverse roll coating, extrusion coating, slide coating and curtain coating. An overview of these coating techniques can be found in "Modern Coating and Drying Technology", Edward Cohen and Edgar B. Gutoff Editors, VCH publishers, Inc, New York, N.Y., 1992. A plurality of layers may be coated simultaneously, e.g. by coating techniques such as slide coating or curtain coating. The substrate may be provided with a functional layer as a sheet or as a web. The latter is especially preferred for industrial roll-to-roll manufacturing of devices such as FPDs which may significantly reduce the cost of the process compared to the batch methods that are being used at present.

A highly preferred FPD is an LCD. A typical LCD cell comprises a module of two parallel substrates which each carry on their inner surface an electroconductive layer and a liquid crystal orientation layer, also called alignment layer. In colour LCDS, one of the substrates is also provided with a colour filter. These electroconductive layers, alignment layers and colour filters shall be regarded as a functional layer which may be applied according to the method of the present invention.

A liquid crystal orientation layer typically consists of a polyimide film which is mechanically rubbed so that the director of the liquid crystal molecules aligns itself with the rubbing direction. More information can be found in e.g. "Surface alignment of liquid crystals by rubbed polymer layers", by A. Mosley and B. M. Nicholas, published in Displays, pp. 17–21, Jan. 1987.

Coatings consisting of tin oxide, indium oxide or tin-doped indium oxide (ITO) are widely used as electroconductive layers in FPDs because these materials possess high transparency in the visible spectrum combined with a fairly low electrical resistivity. ITO can be coated by e.g. RF-sputtering from an ITO target, described by J. L. Vossen in Physics of thin films, pp. 1–71, Academic Press, New York (Plenum Press, 1977) or reactive DC magnetron sputtering from an indium-tin target, described in Thin Solid Films, Vol. 83, pp. 259–260 (1981) and Vol. 72, pp. 469–474 (1980), followed by thermal treatment.

Also functional layers of organic conductive polymers, which are more resistant to bending than inorganic substances such as ITO, can be used. DE-A-41 32 614 discloses the production of film-forming, electroconductive polymers by anodic oxidation of pyrroles, thiophenes, furans or aromatic amines (or their derivatives) is effected with a sulphone compound present in the electrolyte solution. The preparation of electroconductive polythiophenes and polypyrroles is described in U.S. Pat. No. 5 254 648 and in U.S. Pat. No. 5 236 627 respectively. In EP-A-440 957 a method for preparing polythiophene in an aqueous environment and applying polythiophene from an aqueous solution has been described. Such a solution is up until now mostly used in photographic materials as disclosed in e.g. U.S. Pat. No. 5 312 681, U.S. Pat. No. 5 354 613 and U.S. Pat. No. 5 391 472. In EP-A-686 662 it has been disclosed that layers of polythiophene coated from an aqueous composition could be made with high conductivity.

"A functional layer, applied onto the substrate according to the method of the present invention may also be a non-continuous functional layer, e.g. electroconductive patterns defining electric or electronic components such as the rows and columns used for multiplex-addressing in passive-matrix LCDs or the thin-film-transistors (TFTs) and pixel electrodes used in active-matrix LCDS. For the application of such patterns, photolithographic as well as printing techniques can be used. The non-continuous layer can also be formed on the substrate by other techniques, e.g. lamination followed by delamination, ink jet, toner jet, electrophotography, or thermosublimation."

"The colour filters, which similarly to the above electroconductive patterns and layers are not only used in LCDs but also in other FPD types, are another example of a non-continuous functional layer that may be applied in the method of the present invention. The colour filter can be a gelatine-based filter, a vacuum deposited filter, a printed filter, an interference filter, an electrolytically deposited filter, etc. Some suitable examples can be found in e.g. "High quality organic pigment colour filter for colour LCD" by T. Ueno, T. Motomura, S. Naemura, K. Noguchi and C. Tani in Japan Display, 1986, pp. 320–322; "An active matrix colour LCD with high transmittance using an optical interference filter" by T. Unate, T. Nakagawa, Y. Matsushita, Y. Ugai and S. Acki in SID Int. Display Conf., pp. 434–437, 1989; "New process for preparing multi-colour filters for LCDS" by A. Matsumura, M. Ohata and K. Ishikawa in SID Int. Display Conf., pp. 240–2443, 1990; Eurodisplay '87 proceedings, pp. 379–382 and 395–396; EP-B 396 824 and EP-A 615 161."

The method of the present invention can be used during the manufacturing of passive-matrix LCDs as well as active-matrix LCDs such as thin-film-transistor (TFT) displays. Other particular examples are twisted nematic (TN), supertwisted nematic (STN), double supertwisted nematic (DSTN), retardation film supertwisted nematic (RFSTN), ferroelectric (FLC), guest-host (GH), polymer-disperse (PF), polymer network (PN) liquid crystal displays, and so on.

Emissive FPD types which may benefit from the present invention are e.g. plasma displays (PDs), field emission displays (FEDs) and s so-called organic light-emitting displays (OLEDs). In such electroluminescent displays, the electroconducting layers or patterns on at least one of the substrates may be replaced by a non-transparent material, e.g. silver or nickel.

"A typical PD comprises two substrates which enclose a gas-filled volume, the gas being typically one of the noble gases or a mixture thereof. By charging the electrodes present in the gas-filled cavity with a high voltage, typically about 100 V, a plasma discharge is generated which emits UV light. In many designs, the discharges are confined to separate cells (pixels) formed by walls of insulating material between the glass substrates. The UV light may excite phosphors which are present on the cell walls so as to obtain colour images. To eliminate the orange light which may also be emitted by the plasma, colour filters are also used in PDs. The electroconductive layers or patterns may be shielded from the plasma by applying a dielectric protecting layer, which comprises e.g. lead oxide or magnesium oxide. Also said insulating walls, phosphors, colour filters and dielectric protecting layers shall be regarded as a (non-continuous) functional layer which may be applied in the method of the present invention."

FEDs also comprise two substrates which are provided with functional layers. In addition to the electroconductive layers and patterns known from LCDs and PDs, one of the substrates of a FED is provided with a large number of microtips, consisting of e.g. molybdenum, which each act as a microscopic electron gun. When charged up to a high voltage from 200 to 800 V, these microtips emit an electron beam towards a phosphor layer on the opposite substrate which typically carries an ITO layer as a counter electrode. The electroconductive layers and patterns, microtips and phosphor layers in FEDs shall also be regarded as functional layers which may be applied in the method of the present invention.

OLEDs are electroluminescent devices wherein electrons and holes are injected from a cathode and anode respectively into an electroluminescent material, e.g. an electroluminescent polymer such as poly(p-phenylenevinylene) (PPV) and its derivatives, fluorene derivatives or distyrylbenzene compounds, and then recombine to an exciton which relaxes to the ground state by radiative decay. Some particular examples have been disclosed in e.g. U.S. Pat. No. 5,247, 190 and U.S. Pat. No. 5 5,401,827. Detailed information on OLEDs is published in "Organic electroluminescent materials and devices", edited by S. Miyata and H. S. Nalwa, Gordon and Breach Publishers (1997); "Organic Electroluminescent Devices", Science, Vol. 273, p. 884 (16.08.1996); Philips Journal of Research, Vol. 51, No. 4, p. 518–524 (1998); Philips J. Res., vol. 51, p. 511–525 (1998); and in Nature, vol. 347, p. 539 (1990).

In a typical OLED the following functional layers are present between two substrates:
- a reflecting cathode, e.g. a low-work function metal layer such as evaporated Ca.
- an electroluminescent layer, e.g. PPV; other suitable electroluminescent compounds are described in e.g. "Organische Leuchtdioden", Chemie in unserer Zeit, 31. Jahrg. 1997, No. 2, p. 76–86.
- an hole-injection layer, e.g. an organic electroconductive layer.
- an transparent anode, e.g. an ITO layer. Also these layer shall be regared as a functional layer which may be present in the module made according to the present invention.

Although the OLED above comprises two inorganic electrodes, a preferred device made according to the present invention is fully composed of organic layers (excluding the glass sheets) as such layers are resistant to bending, distinguished from brittle inorganic layers such as ITO. Such devices may comprise e.g. all-organic thin-film-transistors as described in Adv. Mater. vol. 2, no. 12, p. 592 (1990).

In addition to the FPDs above, other suitable examples of devices which may be obtained by the present invention are electrolytic capacitors, circuit boards, electrochromic displays, an electronic book such as the one described in WO 97/04398 or a photovoltaic device such as an organic solar cell which comprises a similar structure as the OLED described above, with the proviso that the electroluminescent layer is replaced by a composition wherein photo-induced electron transfer occurs between an electron-donor and an acceptor.

EXAMPLE

A similar device as shown in FIG.1 was prepared. A flexible plastic film consisting of a phenoxy-urethan polymer according to the following formula was used as a substrate :

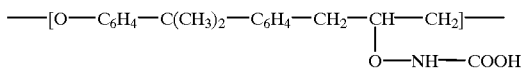

wherein $C_6H_4$ is a phenyl group.

An ITO layer having a thickness of 500 Å was applied on one side of the plastic substrate by low temperature sputtering and then patterned into electrodes by photolithography. A polyimide resin was coated on the electrode surface at a thickness of 500 Å, dried at 150° C. for 1 hour and then rubbed with gauze in one direction so as to obtain a liquid crystal orientation layer. The material thus obtained formed a first substrate. A similar material was prepared as second substrate.

A flexible epoxy adhesive was screenprinted onto the surface of the first substrate in a sealing pattern. A silver-based conductive adhesive was applied to both substrates to form electric contacts. Fine particles of glass fibre having a diameter of 10 μm were scattered on the first substrate and then both substrates were assembled to form a panel and cured by heating at 100° C. during 1 hour. Said panel consisted of a single LCD cell. A liquid crystal composition was injected into the space between both substrates and the seals by vacuum injection. The injection inlet was sealed with an epoxy resin to obtain a liquid crystal display cell.

A polyethylene adhesive layer was then spin-coated on both outer surfaces of the panel. Finally, two borosilicate glass sheets of type AF45 (Schott Glass, Germany) having a thickness of 70 μm were laminated to both sides of the panel. A low-weight, flexible display was obtained which is well protected from oxygen, water vapour, heat and mechanical impact.

What is claimed is:

1. A method of making a module for use in an electric or electronic device, said method comprising the steps of
   (i) providing a flexible substrate with a functional layer by a printing process or a web coating process;
   (ii) bringing said flexible substrate into parallel contact with another substrate so as to obtain a module wherein the functional layer is present between both substrates;
   (iii) laminating a glass sheet having a thickness in the range from 10 μm to 0.7 mm to at least one side of the module.

2. A method of making a module for use in an electric or electronic device, said method comprising the steps of
   (i) providing a flexible substrate with a functional layer;
   (ii) bringing said flexible substrate into parallel contact with another substrate so as to obtain a panel wherein the functional layer is present between both substrates, said panel comprising a plurality of adjacent modules which are mutually separated by a boundary between said modules;
   (iii) laminating a plurality of glass sheets having a thickness in the range from 10 μm to 1.5 mm to at least one side of the panel, wherein the laminated glass sheets are aligned with the modules and are mutually spaced at the boundary between the modules.

3. A method of making a module for use in an electric or electronic device, said method comprising the steps of
   (i) providing a flexible substrate with a functional layer;
   (ii) bringing said flexible substrate into parallel contact with another substrate so as to obtain a panel wherein the functional layer is present between both substrates, said panel comprising a plurality of adjacent modules which are mutually separated by a boundary between said modules;

(iii) cutting the modules at the boundary between said modules;

(iv) laminating a plurality of glass sheets having a thickness in the range from 10 μm to 1.5 mm to at least one side of a module.

4. Method according to claim 2 or 3 wherein the thickness of the glass is in the range from 10 to 700 μm.

5. Method according to claim 1, 2 or 3 wherein the thickness of the glass is in the range from 30 to 500 μm.

6. Method according to claim 1, 2 or 3 wherein the thickness of the glass is in the range from 50 to 300 μm.

7. Method according to claim 1, 2 or 3 wherein the glass is flexible.

8. Method according to claim 1, 2 or 3 wherein the glass is borosilicate or chemically hardened glass.

9. Method according to claim 2 or 3 wherein step (i) is carried out by a printing process or a web coating process.

10. Method according to claim 1, 2 or 3 wherein the glass is replaced by a glass/support laminate.

11. Method according to claim 1, 2 or 3 wherein the device is a flat panel display, a light emitting diode, an electrolytic capacitor, a circuit board, an electrochromic display, an electronic book, an organic solar cell or a photovoltaic cell.

12. Method according to claim 2 or 3 wherein the functional layer is selected from the group consisting of: an electroconductive layer, a colour filter, a liquid crystal alignment layer, a phosphor layer, an insulating wall, a dielectric protecting layer, an electroconductive pattern, microtips, a reflecting cathode, an electroluminescent layer, a hole-injection layer and a transparent anode.

13. Method of making a module for use in an electric or electronic device, said method comprising the steps of (i) providing a flexible substrate with a functional layer selected from the group consisting of an electroconductive layer, a colour filter, a liquid crystal alignment layer, a phosphor layer, an insulating wall, a dielectric protecting layer, an electroconductive pattern, microtips, a reflecting cathode, an electroluminescent layer, a hole-injection layer and a transparent anode;

(ii) bringing said flexible substrate into parallel contact with another substrate so as to obtain a module wherein the functional layer is present between both substrates;

(iii) laminating a glass sheet having a thickness in the range from 10 μm to 0.7 mm to at least one side of the module.

* * * * *